(12) United States Patent
Katano

(10) Patent No.: US 10,546,803 B2
(45) Date of Patent: Jan. 28, 2020

(54) SEMICONDUCTOR DEVICE AND METHOD FOR MANUFACTURING SEMICONDUCTOR DEVICE

(71) Applicant: FUJI ELECTRIC CO., LTD., Kawasaki (JP)

(72) Inventor: Tomonori Katano, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 15/902,317

(22) Filed: Feb. 22, 2018

(65) Prior Publication Data

US 2018/0315683 A1 Nov. 1, 2018

(30) Foreign Application Priority Data

Apr. 27, 2017 (JP) ................................. 2017-088819

(51) Int. Cl.
| | | |
|---|---|---|
| *H01L 23/492* | (2006.01) | |
| *H01L 21/52* | (2006.01) | |
| *H01L 23/00* | (2006.01) | |
| *H01L 23/053* | (2006.01) | |

(52) U.S. Cl.
CPC ............ *H01L 23/492* (2013.01); *H01L 21/52* (2013.01); *H01L 23/053* (2013.01); *H01L 23/562* (2013.01)

(58) Field of Classification Search
CPC ... H01L 23/492; H01L 21/52; H01L 25/0655; H01L 23/053; H01L 23/057; H01L 23/562
USPC .......................................................... 257/692
See application file for complete search history.

(56) References Cited

U.S. PATENT DOCUMENTS

| | | | |
|---|---|---|---|
| 2014/0246769 | A1 | 9/2014 | Takahashi et al. |
| 2015/0187668 | A1 | 7/2015 | Takahashi |

FOREIGN PATENT DOCUMENTS

| | | | |
|---|---|---|---|
| WO | WO 2013/058038 A1 | 4/2013 | |
| WO | WO 2014/073311 A1 | 5/2014 | |

*Primary Examiner* — Hrayr A Sayadian

(57) ABSTRACT

A semiconductor device includes an insulating circuit-substrate on which a semiconductor chip is mounted, a casing accommodating the insulating circuit-substrate, and a plate-shaped terminal-connecting member having both ends suspended so that the terminal-connecting member extends between two opposite side-walls of the casing, the terminal-connecting member having a connection-terminal and load-absorbing portions, the connection-terminal being provided in a central region between the both ends so as to be connected to the semiconductor chip, the load-absorbing portions being provided between fixing points to the casing and the central region, the rigidity of the load-absorbing portions in a longitudinal direction being equal to or less than 50% of the rigidity of the central region so that the load-absorbing portions absorb load applied from the two side-walls and are deformed.

20 Claims, 14 Drawing Sheets

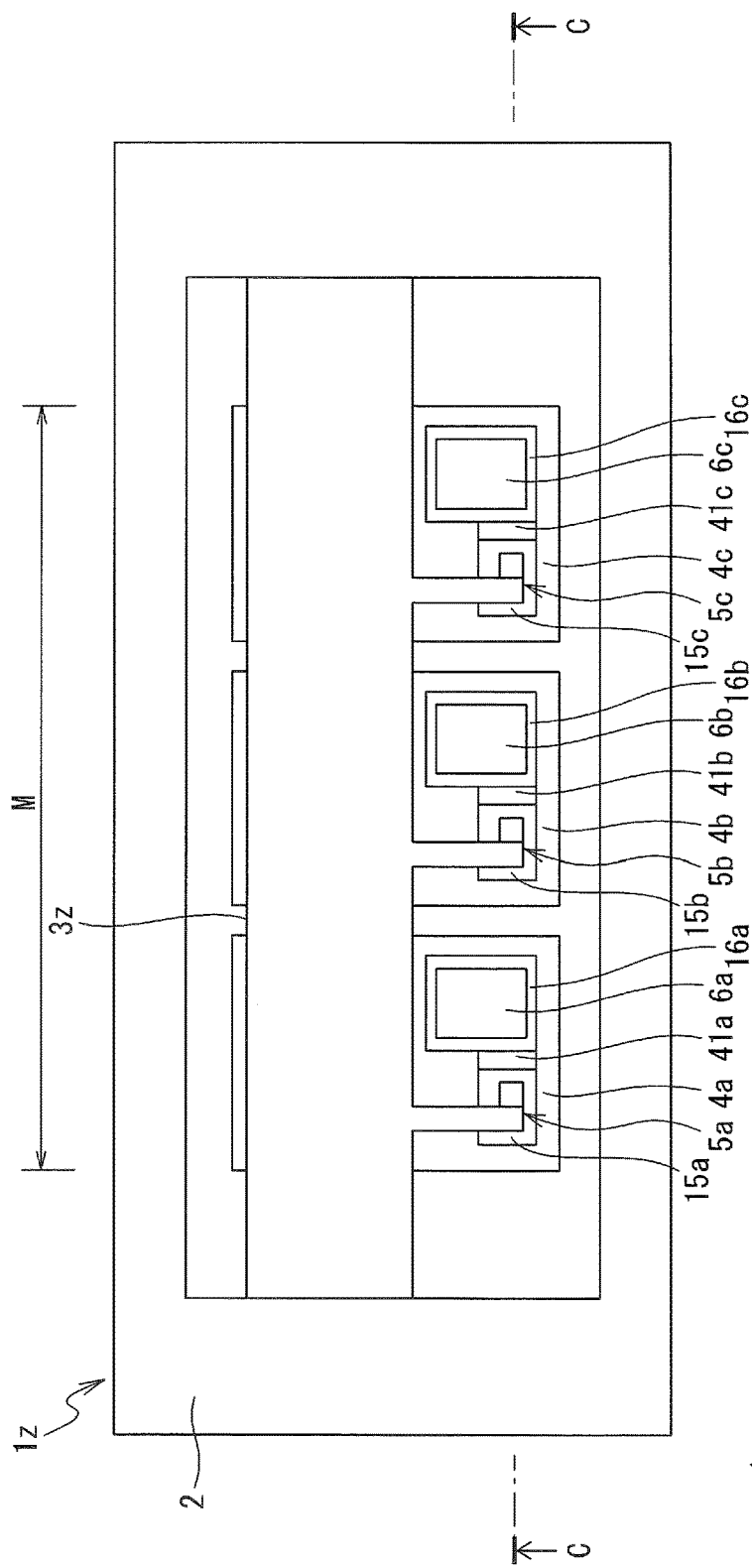
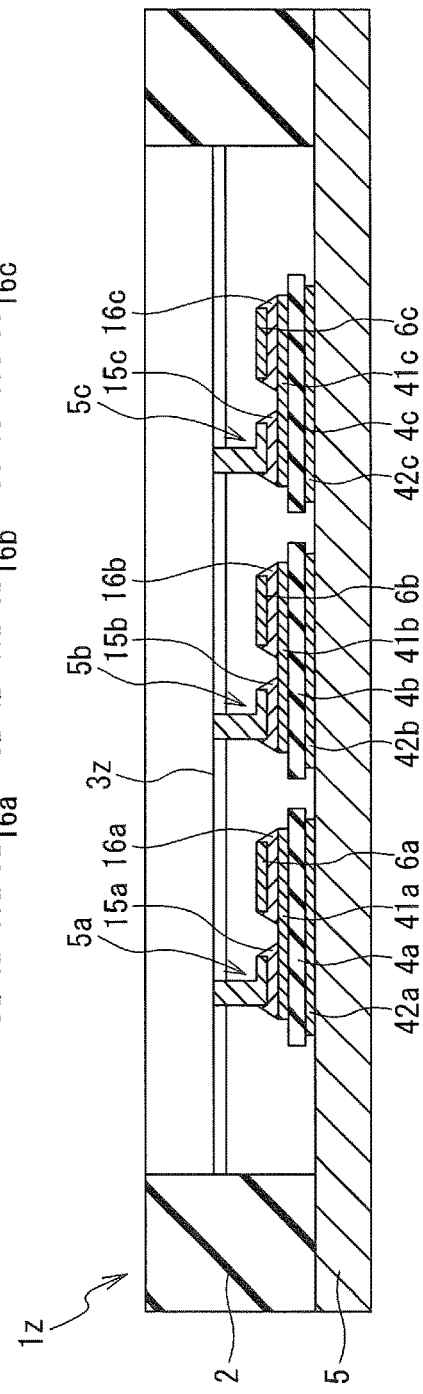
FIG. 4A
FIG. 4B

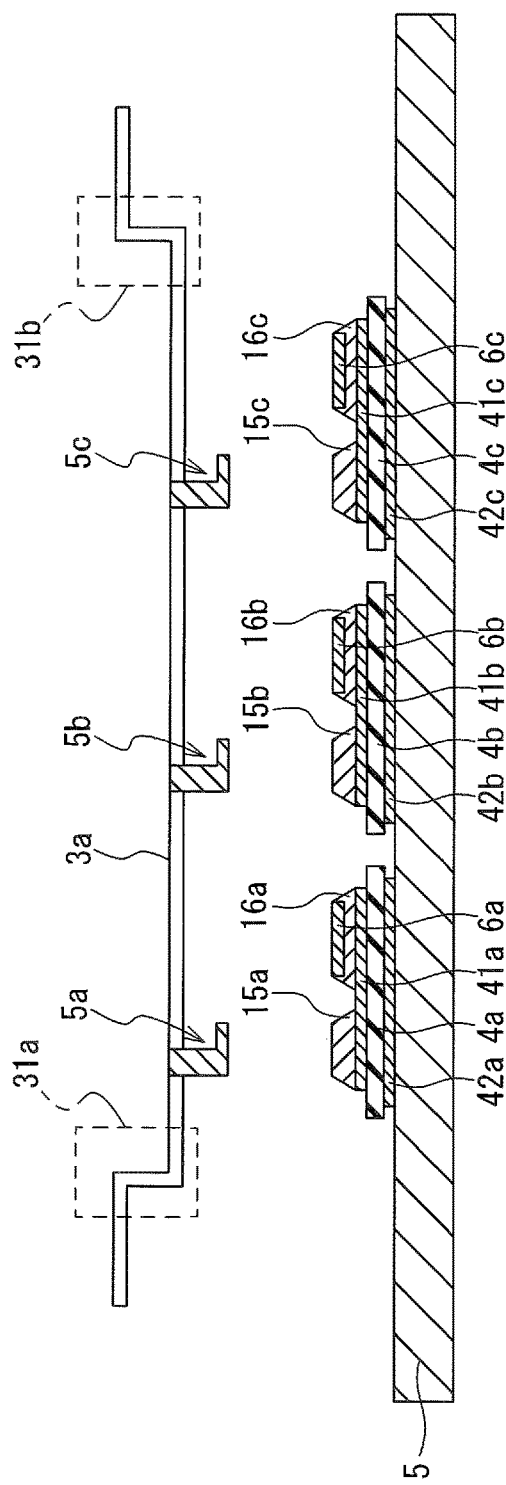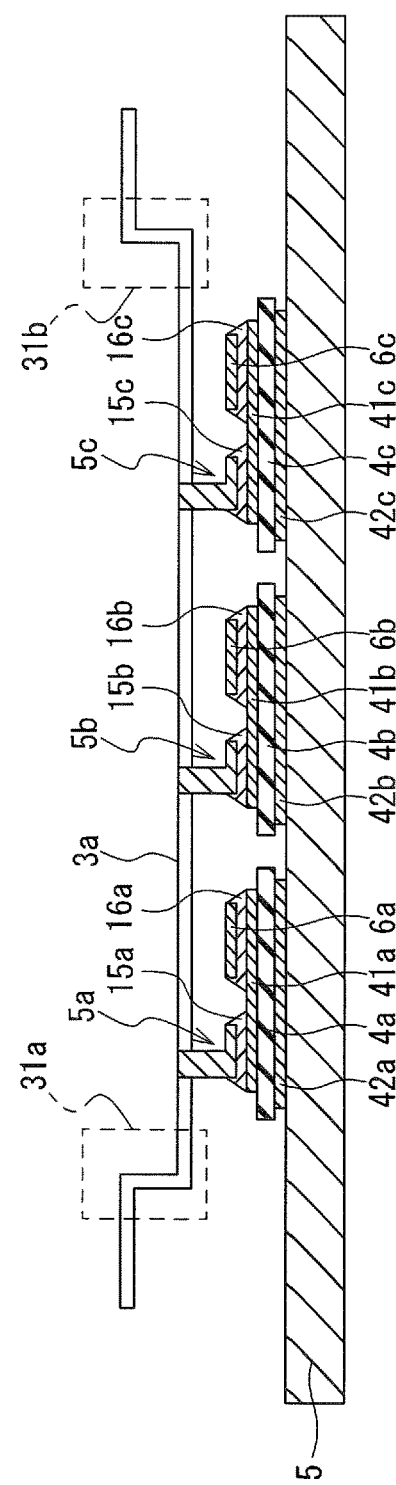
FIG. 10A
FIG. 10B

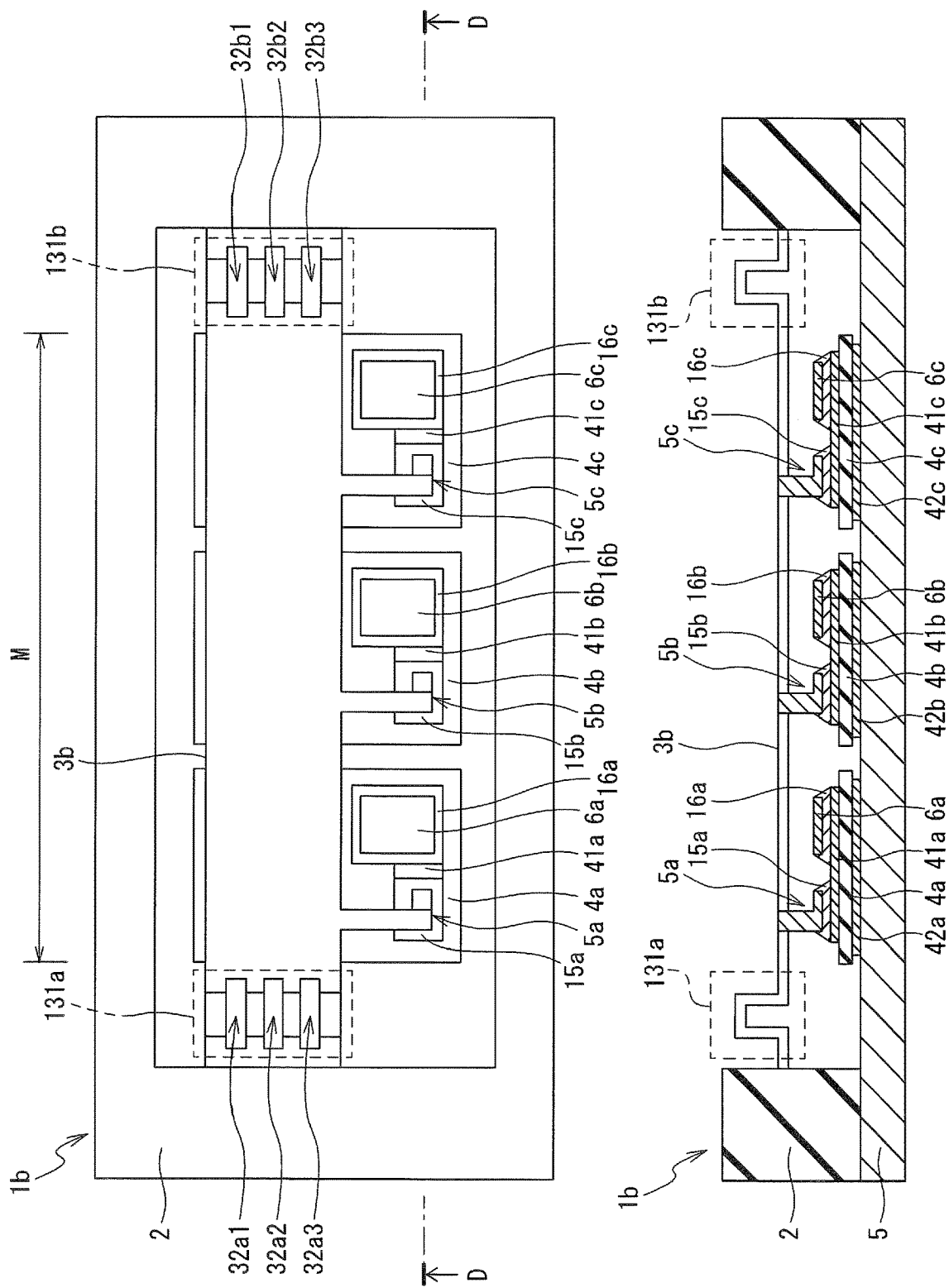

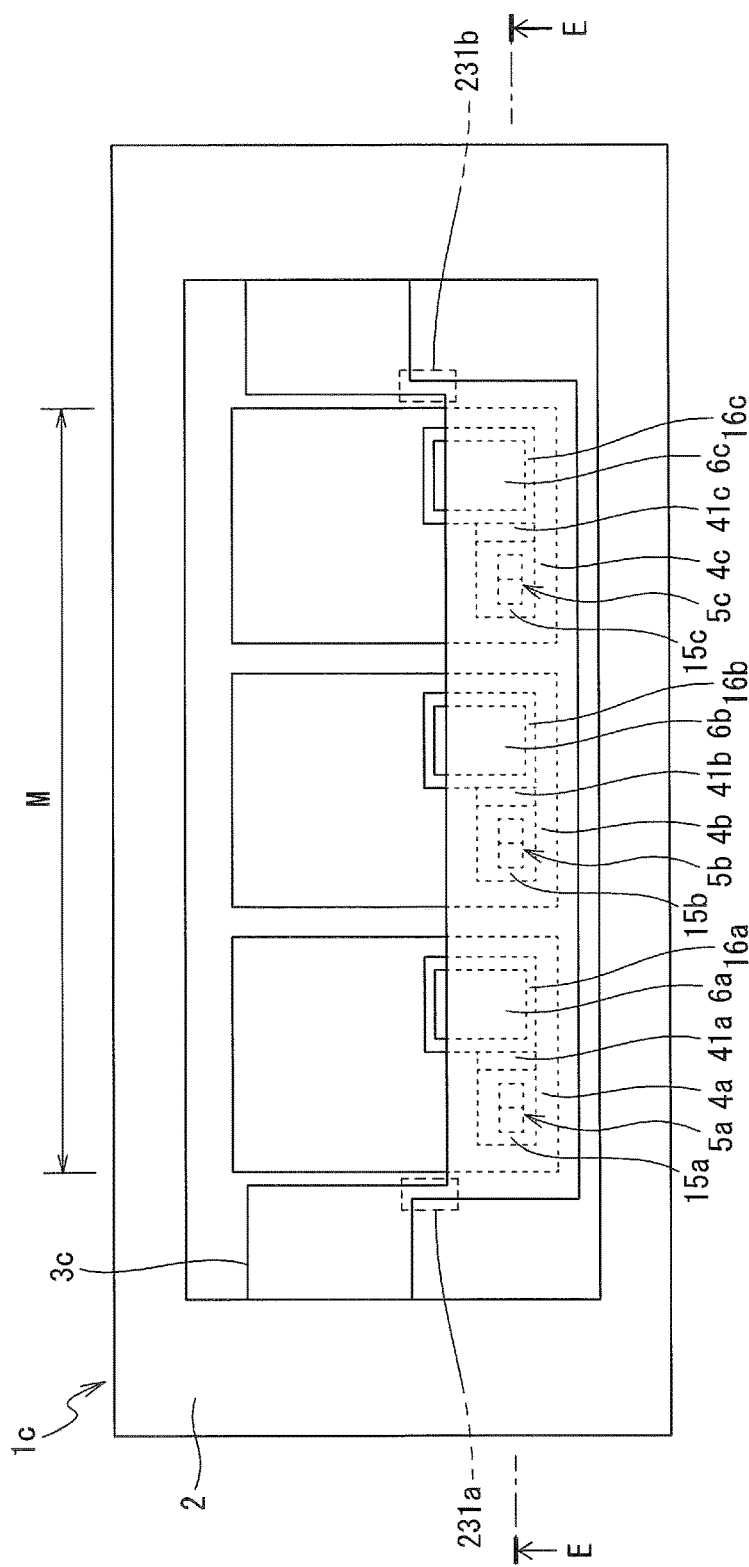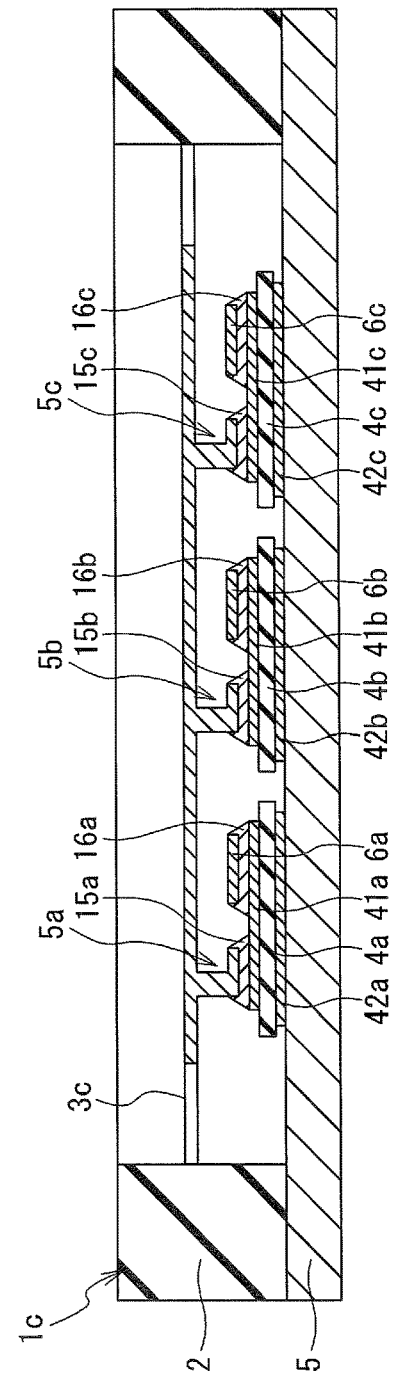
FIG. 14A
FIG. 14B

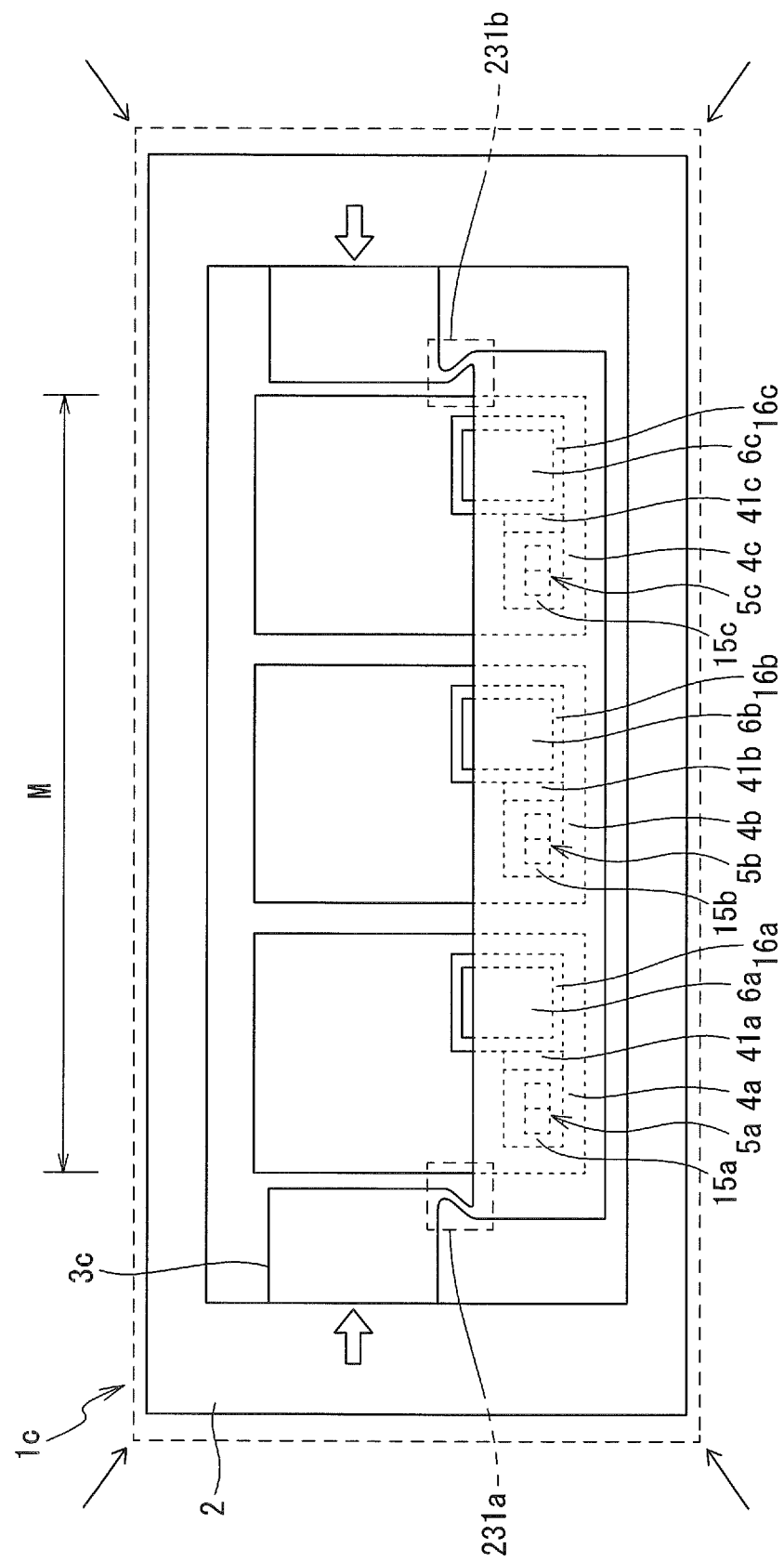

SEMICONDUCTOR DEVICE AND METHOD FOR MANUFACTURING SEMICONDUCTOR DEVICE

CROSS REFERENCE TO RELATED APPLICATIONS AND INCORPORATION BY REFERENCE

This application claims benefit of priority under 35 USC 119 based on Japanese Patent Application No. 2017-088819 filed Apr. 27, 2017, the entire contents of which are incorporated by reference herein.

BACKGROUND OF THE INVENTION

1. Field of the Invention

The present invention relates to a semiconductor device and a method for manufacturing the semiconductor device.

2. Description of the Related Art

In a process of manufacturing a semiconductor device, particularly, a power semiconductor device, a casing for the semiconductor device is integrally molded by sandwiching an insulating circuit-substrate on which a semiconductor chip is mounted and a terminal-connecting member bonded to the insulating circuit-substrate, as insert members, in some cases. The casing has a high temperature of, for example, about 250° C. during molding process, and after the molding process, the casing is cooled to about room temperature. For example, when both the casing is made of a resin and the terminal-connecting member is made of metal, a large difference in linear expansion coefficient exists between the material implementing the casing and the material implementing the terminal-connecting member. Therefore, the casing is more shrunk than the terminal-connecting member during cooling process.

Hence, when the plate-shaped terminal-connecting member is suspended and fixed at side-walls which are opposite to each other with a space between the side-walls in the casing, load is applied to fixing points fixed at each end of the terminal-connecting member during shrinking so that the terminal-connecting member is compressed inward from each of the side-walls. When the terminal-connecting member made of metal warps due to the load, a case that height of a connection-terminal which is provided at the terminal-connecting member for bonding to the insulating circuit-substrate will change is likely to occur. As a result, a failure, such as poor electrical-contact, is likely to occur in a bonding region at which the connection-terminal and the insulating circuit-substrate are bonded together.

As a technique that can control the warpage of the terminal-connecting member, for example, WO 2013/058038 A discloses a technique which provides a hole with a width of about one millimeter and a depth of about one millimeter in each top surface of both ends of a terminal-connecting member, which is suspended between side-walls of a casing, by use of groove made through press working. In the technique disclosed in WO 2013/058038 A, a direction of deformation of the terminal-connecting member is accelerated to a determined direction so that the terminal-connecting member warps toward an insulating circuit-substrate provided below the terminal-connecting member, due to heat which is applied to the hole of the groove during soldering process.

In addition, WO 2014/073311 A discloses a technique in which an insulating block is provided in the vicinity of a center of a terminal-conductor corresponding to the terminal-connecting member, and the distance between adjacent terminal-conductors which are parallel to each other with a constant gap in the up-down direction in the casing is maintained at a predetermined value or more. In the technique disclosed in WO 2014/073311 A, deformation of the terminal-conductor in the lower side caused by thermal expansion during soldering is physically restrained by the insulating block provided in the terminal-conductor in the upper side.

However, in the technique disclosed in WO 2013/058038 A, the connection-terminal of the terminal-connecting member is deformed so as to be pressed against the insulating circuit-substrate and the height of the connection-terminal changes. Therefore, there is a failure that the insulating circuit-substrate will be damaged by the pressing force is likely to occur. In addition, in the technique disclosed in WO 2014/073311 A, no problems occur when the terminal-conductor in the lower side warps upward. However, when the terminal-conductor in the lower side warps downward, a failure that the insulating circuit-substrate will be damaged, as in the technique disclosed in WO 2013/058038 A is likely to occur.

SUMMARY OF THE INVENTION

The present invention has been made in view of the above-mentioned problems and an object of the present invention is to provide a semiconductor device and a method for manufacturing the semiconductor device which can restrain a change in the height of a connection-terminal that is provided with a terminal-connecting member and bonded to an insulating circuit-substrate, even when load is applied to each of both ends of the terminal-connecting member, and in which the connection-terminal and the terminal-connecting member are appropriately bonded to each other so that the semiconductor device has high reliability.

In order to solve the above-mentioned problems, an aspect of a present invention inheres in a semiconductor device including: an insulating circuit-substrate on which a semiconductor chip is mounted; a casing accommodating the insulating circuit-substrate; and a plate-shaped terminal-connecting member having both ends suspended so that the terminal-connecting member extends between two opposite side-walls of the casing, the terminal-connecting member having a connection-terminal and load-absorbing portions, the connection-terminal being provided in a central region between the both ends so as to be connected to the semiconductor chip, the load-absorbing portions being provided between fixing points to the casing and the central region, the rigidity of the load-absorbing portions in a longitudinal direction being equal to or less than 50% of the rigidity of the central region so that the load-absorbing portions absorb load applied from the two side-walls and are deformed.

Another aspect of the present invention inheres in a method for manufacturing a semiconductor device including: mounting a semiconductor chip on an insulating circuit-substrate; preparing a plate-shaped terminal-connecting member having a connection-terminal and load-absorbing portions, the connection-terminal being provided in a central region, the load-absorbing portions being provided outside the central region, the rigidity of the load-absorbing portions in a longitudinal direction being equal to or less than 50% of the rigidity of the central region; connecting the connection-terminal to the semiconductor chip; and inserting the insulating circuit-substrate and the terminal-connecting member into the casing so that the terminal-connecting member is fixed at two opposite side-walls of the casing outside the load-absorbing portions and is suspended and extends between the two side-walls and integrally molding the casing, wherein the load-absorbing portions absorb load applied from the two side-walls and are deformed when the integrally molded casing is shrunk.

BRIEF DESCRIPTION OF THE DRAWINGS

FIG. 4A is a plan view schematically illustrating an outline of the structure of a semiconductor device before shrinking according to a comparative example;

FIG. 4B is a cross-sectional view taken along the line C-C in FIG. 4A;

FIG. 10 is a process cross-sectional view schematically illustrating a method for manufacturing the semiconductor device according to the first embodiment in the order from FIG. 10A to FIG. 10B;

FIG. 11A is a plan view schematically illustrating an outline of the structure of a semiconductor device before shrinking according to a second embodiment;

FIG. 11B is a cross-sectional view taken along the line D-D in FIG. 11A;

FIG. 14A is a plan view schematically illustrating an outline of the structure of a semiconductor device before shrinking according to a third embodiment;

FIG. 14B is a cross-sectional view taken along the line E-E in FIG. 14A; and

FIG. 15 is a plan view schematically illustrating an outline of the structure of the semiconductor device after shrinking according to the third embodiment.

DETAILED DESCRIPTION OF THE PREFERRED EMBODIMENTS

Figures 1A, 1B:
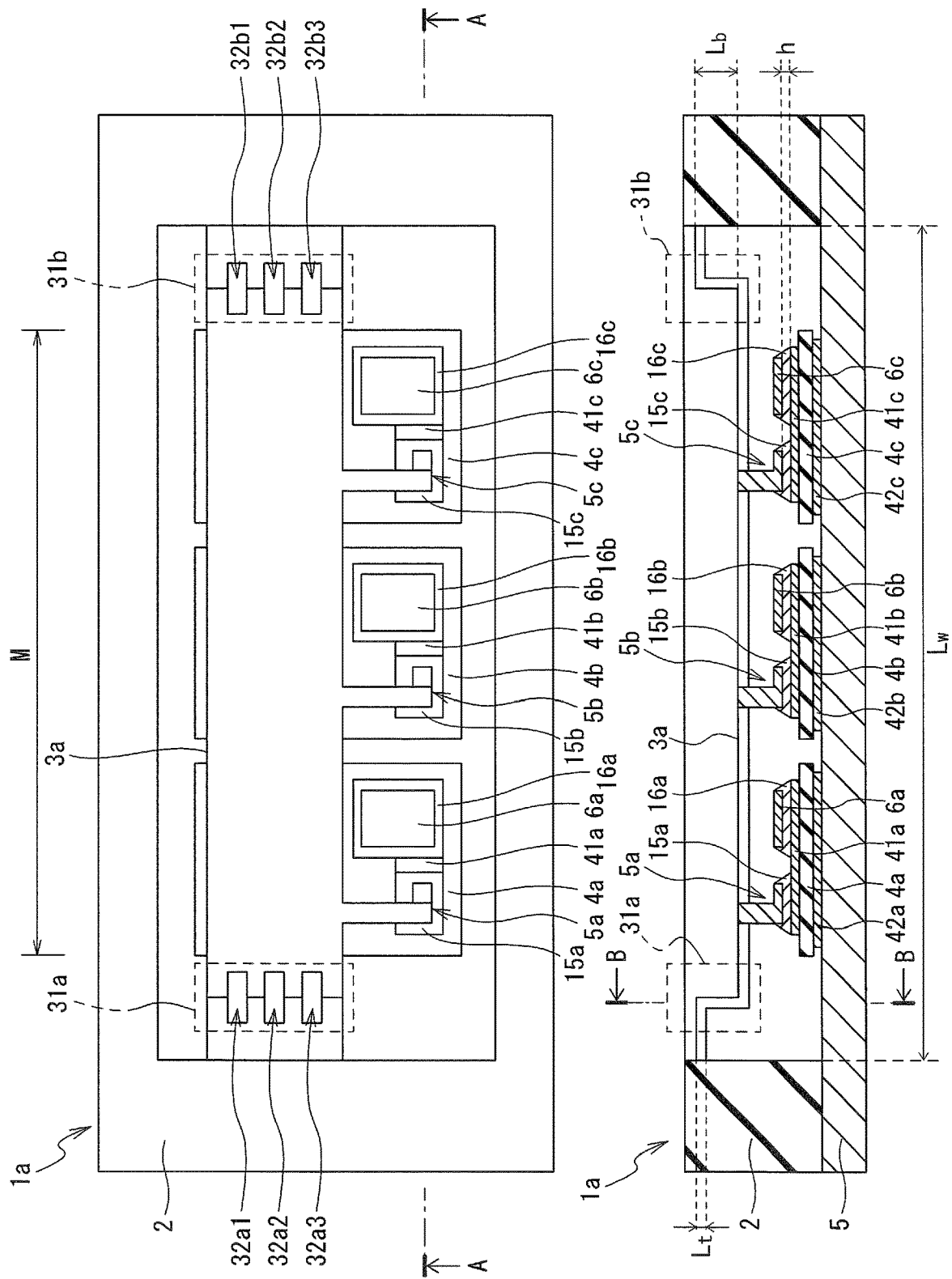
FIG. 1A is a plan view schematically illustrating an outline of the structure of a semiconductor device before shrinking according to a first embodiment.
FIG. 1B is a cross-sectional view taken along the line A-A in FIG. 1A.

Hereinafter, first to the third embodiments of the present invention will be described. In the description of the following drawings, the same or similar portions are denoted by the same or similar reference numerals. However, the drawings are schematically illustrated and it is noted that, for example, the relationship between a thickness and plane dimensions and the thickness ratio of each device or each member are different from the actual relationship and the actual thickness ratio. Therefore, the detailed thickness or dimensions can be determined with reference to the following description. In addition, of course, the drawings include portions with different dimensional relationships or ratios.

In the following description, the "left-right" or "up-down" direction is simply defined for only convenience of explanation and does not limit the technical spirit of the present invention. Therefore, for example, when a plane of paper is rotated 90 degrees, the "left-right" direction and the "up-down" direction are switched. Of course, when the plane of paper is rotated 180 degrees, the "left" changes to the "right" and the "right" changes to the "left".

First Embodiment

—Structure of Semiconductor Device—

A semiconductor device $1a$ according to a first embodiment includes a plate-shaped base portion 5 illustrated in FIG. 1B, and a first insulating circuit-substrate ($4a$, $41a$, $42a$) to a third insulating circuit-substrate ($4c$, $41c$, $42c$) which are provided on the base portion 5 and on which a first semiconductor chip $6a$ to a third semiconductor chip $6c$ are mounted respectively, as illustrated in FIGS. 1A and 1B. In addition, the semiconductor device $1a$ according to the first embodiment includes a casing 2 which is provided on the base portion 5 and accommodates the first insulating circuit-substrate ($4a$, $41a$, $42a$) to the third insulating circuit-substrate ($4c$, $41c$, $42c$). In the casing 2, a plate-shaped terminal-connecting member $3a$ is provided to extend as a beam structure between two opposite side-walls which are located on the left and right sides of FIGS. 1A and 1B. Each of both ends of the terminal-connecting member $3a$ are suspended and fixed to the side-walls respectively.

The terminal-connecting member $3a$ includes a first connection-terminal $5a$ to a third connection-terminal $5c$ and three connection-terminals are electrically connected to the first semiconductor chip $6a$ to the third semiconductor chip $6c$, respectively. In addition, the terminal-connecting member $3a$ includes a first load-absorbing portion $31a$ that is provided between an fixing point to the left side-wall and a central region M in FIGS. 1A and 1B. The terminal-connecting member $3a$ includes a second load-absorbing portion $31b$ which is provided between an fixing point to the right side-wall and the central region M in FIGS. 1A and 1B. The first load-absorbing portion $31a$ and the second load-absorbing portion $31b$ are provided respectively at each end of the outside of the central region M in the longitudinal direction in which the terminal-connecting member $3a$ is provided to extend.

The terminal-connecting member $3a$ can be implemented in a plate-shaped or a rod-shaped totally, and includes, for example, copper so that the conductivity of the terminal-connecting member 3a increases. The terminal-connecting member 3a serves as a member for conductive connecting such as a so-called "bus bar". The terminal-connecting member 3a electrically connects, for example, between external connection-terminals which are buried inside the side-walls of the casing 2 and the first insulating circuit-substrate (4a, 41a, 42a) to the third insulating circuit-substrate (4c, 41c, 42c). Illustration of the external connection-terminal etc. are omitted. The terminal-connecting member 3a connects between the bottom surfaces of the first semiconductor chip 6a to the third semiconductor chip 6c and the outside of the semiconductor device 1a.

The casing 2 can be made of an insulating material, such as a polyphenylene sulfide resin, and a frame-type having a rectangular outer edge in a plane pattern. That is, the casing 2 has a rectangular parallelepiped shape with an open bottom and an open top. The base portion 5 is made of, for example, metal and is used for dissipation of heat from the semiconductor device 1a.

As illustrated in FIGS. 1A and 1B, the first insulating circuit-substrate (4a, 41a, 42a) to the third insulating circuit-substrate (4c, 41c, 42c) are disposed at substantially equal intervals at the center of the top surface of the base portion 5. The first insulating circuit-substrate (4a, 41a, 42a) to the third insulating circuit-substrate (4c, 41c, 42c) include first to the third insulating substrates 4a and 4c which include ceramic, etc. The first top-surface conductive-layer 41a to the third top-surface conductive-layer 41c are provided on the top surfaces of the first insulating substrate 4a to the third insulating substrate 4c, respectively and circuit patterns are delineated in the first top-surface conductive-layer 41a to the third top-surface conductive-layer 41c. First terminal-soldering portions 15a to the third terminal-soldering portion 15c are provided on the first top-surface conductive-layer 41a to the third top-surface conductive-layer 41c, respectively. In addition, the first bottom-surface conductive-layer 42a to the third bottom-surface conductive-layer 42c are provided on the bottom surfaces of the first insulating substrate 4a to the third insulating substrate 4c, respectively. The first bottom-surface conductive-layer 42a to the third bottom-surface conductive-layer 42c are bonded to the base portion 5 by solder, etc.

The first terminal-soldering portion 15a to the third terminal-soldering portion 15c which are made of solder are provided in partial regions of the top surfaces of the first top-surface conductive-layer 41a to the third top-surface conductive-layer 41c, respectively. In addition, first chip-soldering portion 16a to the third chip-soldering portion 16c which are made of solder are provided in the other regions of the top surfaces of the first top-surface conductive-layer 41a to the third top-surface conductive-layer 41c, respectively.

The first terminal-soldering portion 15a to the third terminal-soldering portion 15c and the corresponding first chip-soldering portion 16a to the third chip-soldering portion 16c are electrically connected to each other by, for example, wire bonding. The first connection-terminal 5a to the third connection-terminal 5c of the terminal-connecting member 3a are bonded to the top surfaces of the first terminal-soldering portion 15a to the third terminal-soldering portion 15c, respectively. In addition, the first semiconductor chip 6a to the third semiconductor chip 6c which serves as semiconductor elements are bonded and mounted on the top surfaces of the first chip-soldering portion 16a to the third chip-soldering portion 16c, respectively.

The first connection-terminal 5a to the third connection-terminal 5c of the terminal-connecting member 3a are disposed at substantially equal intervals along the longitudinal direction in the central region M of the terminal-connecting member 3a. A connection structure between the first insulating circuit-substrate (4a, 41a, 42a) and the first connection-terminal 5a, a connection structure between the second insulating circuit-substrate (4b, 41b, and 42b) and the second connection-terminal 5b, and a connection structure between the third insulating circuit-substrate (4c, 41c, 42c) and the third connection-terminal 5c are equivalent to each other. Therefore, hereinafter, the connection structure between the first insulating circuit-substrate (4a, 41a, 42a) and the first connection-terminal 5a will be described as a representative example and the description of the same structure will not be repeated.

The terminal-connecting member 3a is suspended at a position that is slightly shifted upward from the center in the up-down direction in the rectangular opening portion of the casing 2 illustrated in FIG. 1A so as to extend in the left-right direction. Therefore, a region which is located below the terminal-connecting member 3a in an internal space of the casing 2 illustrated in FIG. 1A in the plane pattern is larger than an opposite region which is located above the terminal-connecting member 3a. As illustrated in FIG. 1A, the first connection-terminal 5a of the terminal-connecting member 3a has a region that horizontally extends to the side space, which corresponds to the region below the terminal-connecting member 3a in FIG. 1A, so as to protrude toward the first terminal-soldering portion 15a provided on the first insulating circuit-substrate (4a, 41a, 42a). The "width" of the terminal-connecting member 3a is a length measured in the up-down direction in FIG. 1A which is perpendicular to the direction in which the terminal-connecting member 3a extends. As illustrated in FIG. 1B, the first connection-terminal 5a is bent about 90 degrees so as to extend downward from the leading end of the protruding region to the top surface of the first terminal-soldering portion 15a on the first insulating circuit-substrate (4a, 41a, 42a). The first connection-terminal 5a that extends downward is further bent about 90 degrees in the upper part of the first terminal-soldering portion 15a and has an L-shape in a side-view pattern taken along a direction in which thickness of the first connection-terminal 5a can be seen.

That is, the first connection-terminal 5a serves as a leg which extends downward from the terminal-connecting member 3a to the first insulating circuit-substrate (4a, 41a, 42a). As illustrated in FIG. 1B, an L-shaped lower portion of the first connection-terminal 5a is bonded to the top surface of the first terminal-soldering portion 15a. In FIG. 1B, the height between the bottom of the L-shaped lower portion of the third connection-terminal 5c and the top surface of the third top-surface conductive-layer 41c is represented by the numeral h, using two horizontal auxiliary lines. Similarly to the structure between the third connection-terminal 5c and the third top-surface conductive-layer 41c, a constant height h is formed between the bottom of the L-shaped lower portion of the first connection-terminal 5a and the top surface of the first top-surface conductive-layer 41a on the first insulating circuit-substrate (4a, 41a, 42a).

As illustrated in FIGS. 1A and 1B, the first load-absorbing portion 31a and the second load-absorbing portion 31b are symmetrically provided, with the central region M of the terminal-connecting member 3a interposed between the first load-absorbing portion 31a and the second load-absorbing portion 31b, and have the same structure each other. For description of the structure of the first load-absorbing portion 31a and the second load-absorbing portion 31b, the structure of the first load-absorbing portion 31a will be described as a representative example as follows, and the description of the same structure will not be repeated.

As illustrated in the left side of FIG. 1B, the first load-absorbing portion 31a is provided between the fixing point of the terminal-connecting member 3a to the casing 2 and the position which the first connection-terminal 5a in the central region M protrudes. The fixing point of the terminal-connecting member 3a to the casing 2 is located at an upper part of the inner wall surface of the left side-wall of the casing 2 in FIG. 1B. First, the terminal-connecting member 3a horizontally extends to a substantially middle position between the fixing point to the casing 2 and the central region M in the direction from the fixing point to the central region M of the terminal-connecting member 3a.

Then, the terminal-connecting member 3a is bent downward about 90 degrees at the middle position between the fixing point and the central region M and extends downward from a position at which height is substantially equal to the height of the fixing point to the casing 2, to the top surface of the base portion 5. Then, the terminal-connecting member 3a extends vertically, and is bent about 90 degrees toward the right side-wall of the casing 2 at a substantially intermediate height between the position of the fixing point to the casing 2 and the first insulating circuit-substrate (4a, 41a, 42a), and extends horizontally. Then, the terminal-connecting member 3a continuously extends to the central region M in which the first connection-terminal 5a is provided.

That is, the terminal-connecting member 3a is bent so as to have two bent portions which are bent in the up-down direction between the fixing point to the casing 2 and the first connection-terminal 5a in the central region M. Therefore, as illustrated in FIG. 1B, a region extending from the fixing point to the casing 2 to the central region M through the first load-absorbing portion 31a is delineated in Z-shaped or step-shaped in a side-view pattern.

The first load-absorbing portion 31a of the semiconductor device 1a according to the first embodiment is implemented by a Z-shaped or step-shaped bent structure which is surrounded by a dashed line in FIGS. 1A and 1B. In the Z-shaped or step-shaped structure illustrated in FIG. 1B, in the first load-absorbing portion 31a which is the left load-absorbing portion in the terminal-connecting member 3a, a step is formed so that a region which is closer to the fixing point to the left casing 2 than the first load-absorbing portion 31a is higher than the central region M on the right side of the first load-absorbing portion 31a.

Figure 2:
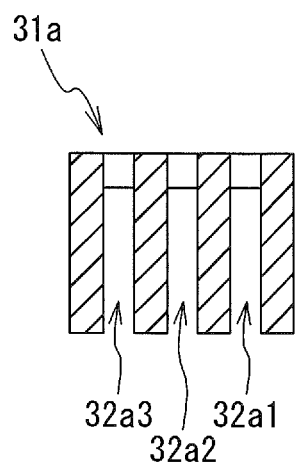
FIG. 2 is a cross-sectional view taken along the line B-B in FIG. 1B.

As illustrated in FIG. 1A and FIG. 2, three slits 32a1 to 32a3 are provided in the first load-absorbing portion 31a at substantially equal intervals. The maximum value of rigidity of the first load-absorbing portion 31a in the terminal-connecting member 3a is set to be equal to or less than about 50%—one half—of the rigidity of the central region M, through the bent structure of the first load-absorbing portion 31a and the three slits 32a1 to 32a3.

The rigidity of the first load-absorbing portion 31a is defined, by value of "applied load" divided by "amount of displacement in the longitudinal direction". In addition, the rigidity of the first load-absorbing portion 31a measured for the definition is measured for a period which is from the start at which the application of load to each of both ends of the terminal-connecting member 3a respectively, to the time immediately before the terminal-connecting member 3a warps. Also, the rigidity of the first load-absorbing portion 31a measured for the definition is measured within an elastic deformation period of the terminal-connecting member 3a in which the amount of deformation of the first load-absorbing portion 31a changes linearly.

The minimum value of the rigidity of the first load-absorbing portion 31a is set so that the minimum cross-sectional area in the first load-absorbing portion 31a is implemented in which desired amount of main current flow to the terminal-connecting member 3a when the main current flows to the semiconductor device 1a.

As illustrated in FIG. 1A, the second load-absorbing portion 31b of the terminal-connecting member 3a which is provided in the vicinity of the right side-wall of the casing 2 includes three slits 32b1 to 32b3 having the same structure as the three slits 32a1 to 32a3 of the first load-absorbing portion 31a. Similarly to the first load-absorbing portion 31a, rigidity of the second load-absorbing portion 31b is set to be equal to or less than about 50% of the rigidity of the central region M by the bent structure of the second load-absorbing portion 31b and the three slits 32b1 to 32b3.

Here, for example, a case is considered in which, as illustrated in FIG. 1B, the terminal-connecting member 3a has a substantially constant thickness $L_t$ over the entire length $L_w$ of the beam portion between the side-walls of the casing 2 and the first load-absorbing portion 31a and the second load-absorbing portion 31b have a step with a height $L_h$. The height $L_h$ of the step is the distance between the top surfaces of the left and right sides of the bent portion in the terminal-connecting member 3a. First, a plate-shaped member that has a thickness $L_t$ of about one millimeter and includes copper as a main material is prepared as the terminal-connecting member 3a.

Then, as the slits 32a1 to 32a3 and the slits 32b1 to 32b3 exemplified in FIG. 1A, a predetermined number of slits with a predetermined width, the slits 32a1 to 32a3 and the slits 32b1 to 32b3 are formed at each of both ends of the prepared plate-shaped member. However, the slits may be provided in only a region which is interposed and vertically extends between two bent portions in each of the first load-absorbing portion 31a and the second load-absorbing portion 31b of the terminal-connecting member 3a illustrated in FIG. 1A. Alternatively, the slits may be provided not only within the region which vertically extends, but also provided to extend at an upper region of the terminal-connecting member 3a, at a lower region of the terminal-connecting member 3a, or at the both region s of the terminal-connecting member 3a.

In addition, as illustrated in FIG. 1B, a bent portion is provided so that the Z-shape in a side-view pattern is implemented. Then, the bent portion is provided so that the width of a region which substantially contributes to rigidity and comprises only substantial parts of a plate-shaped member except the width of a spatial portion corresponding to the slits of the first load-absorbing portion 31a and the second load-absorbing portion 31b in the bent portion is half "one-half" of the width of the central region M. Then, the terminal-connecting member 3a which includes the beam portion with a total length $L_w$ of about 100 millimeters and the first and second load-absorbing portion 31a and the second load-absorbing portion 31b in which the height $L_h$ of a step in the bent portion is about six millimeters is manufactured.

After calculating the rigidity of the first load-absorbing portion 31a and the second load-absorbing portion 31b of the obtained terminal-connecting member 3a, the rigidity is about 20% "one-fifth" of the rigidity of the central region M. In other words, the rigidity of the first load-absorbing portion 31a and the second load-absorbing portion 31b of the terminal-connecting member 3a in the semiconductor device according to the first embodiment can be about lowered to 20% "one-fifth", and much less than the rigidity of a terminal-connecting member including a flat beam structure which extends wholly in a straight line in a side-view pattern, without a bent portion.

Figure 3:
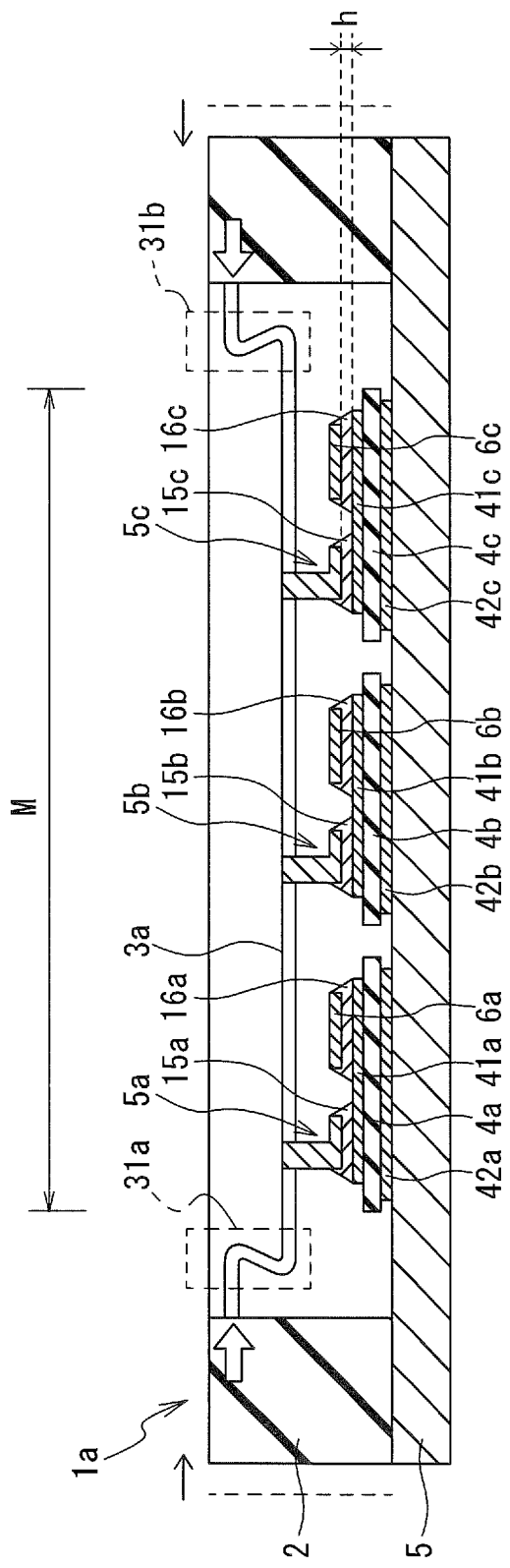
FIG. 3 is a cross-sectional view schematically illustrating an outline of the structure of the semiconductor device after shrinking according to the first embodiment.

Here, FIGS. 1A and 1B are diagrams illustrating a state before the casing 2 is shrunk by cooling process when the casing 2 is integrally molded with insert members after the first insulating circuit-substrate (4a, 41a, 42a) to the third insulating circuit-substrate (4c, 41c, 42c) on the base portion 5 and the terminal-connecting member 3a are inserted into the casing 2. The casing 2 is heated to, for example, about 250° C. before shrinking. FIG. 3 is a diagram illustrating the state of the casing 2 which has been shrunk by cooling process after the integral molding and the casing 2 is about room temperature.

With the progress of cooling process, the casing 2 is shrunk more than the terminal-connecting member 3a is shrunk due to a difference in linear expansion coefficient between the material implementing the casing 2 and the material implementing the terminal-connecting member 3a. For example, when the casing 2 is made of a polyphenylene sulfide resin and the terminal-connecting member 3a is made of a metal material such as copper, a difference in shrinking becomes significantly large. Then, as illustrated in FIG. 3, load is applied to the terminal-connecting member 3a which are fixed at two opposite left and right side-walls of the casing 2 so that the terminal-connecting member 3a are shrunk inward from each of the side-wall of the casing 2 at each end of the fixing points of the terminal-connecting member 3a.

Here, in the terminal-connecting member 3a, each of the rigidity of the first load-absorbing portion 31a and the second load-absorbing portion 31b, which is located closer to corresponding side-wall of the casing 2 respectively than the central region M is greatly lowered and is set to be equal to or less than 50% of the rigidity of the central region M between the first load-absorbing portion 31a and the second load-absorbing portion 31b. Therefore, when load is applied to the terminal-connecting member 3a, the first load-absorbing portion 31a and the second load-absorbing portion 31b actively absorb the load applied from the side-walls of the casing 2 and are deformed before the load is applied to the central region M. As illustrated in FIG. 3, the first load-absorbing portion 31a and the second load-absorbing portion 31b limit and keep the influence of the load applied from the casing 2 only to the region of the first load-absorbing portion 31a and the second load-absorbing portion 31b. Therefore, after the casing 2 is shrunk, each height h of the first connection-terminal 5a to the third connection-terminal 5c which are fixed at the terminal-connecting member 3a so as to extend downward is not changed from predetermined value before the casing 2 is shrunk. As a result, the height between the first connection-terminal 5a to the third connection-terminal 5c and the first terminal-soldering portion 15a to the third terminal-soldering portion 15c on the first insulating circuit-substrate (4a, 41a, 42a) to the third insulating circuit-substrate (4c, 41c, 42c) is appropriately maintained respectively.

Comparative Example

Figure 5:
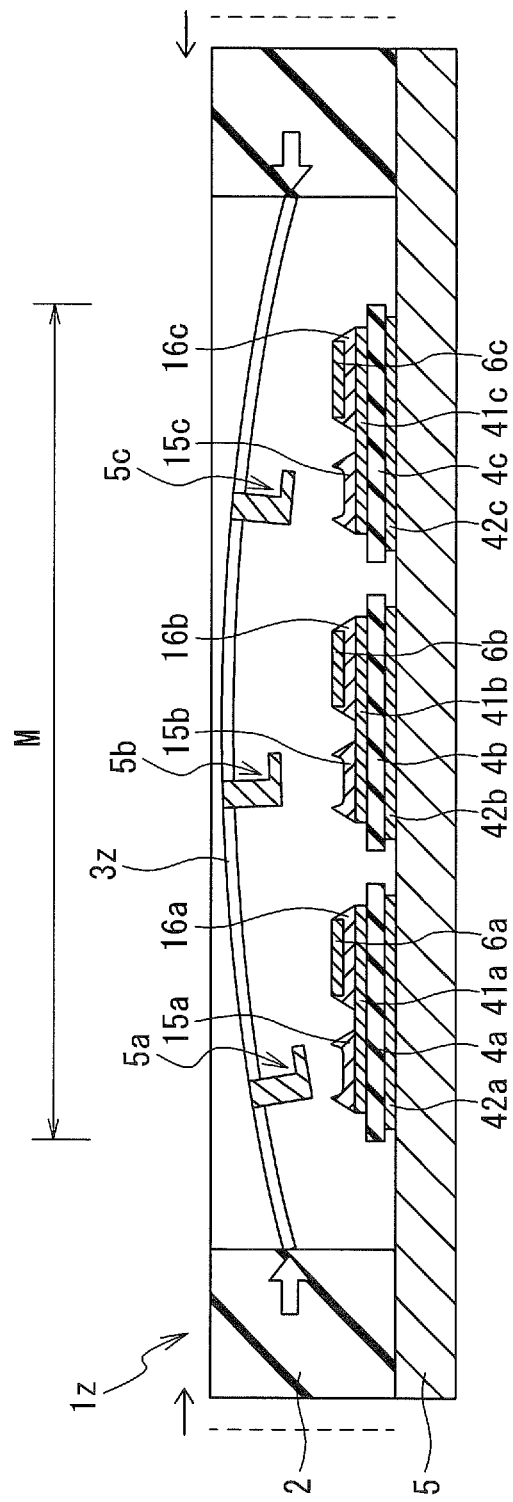
FIG. 5 is a cross-sectional view schematically illustrating an outline of the structure of the semiconductor device after shrinking according to the comparative example.

In contrast, FIGS. 4A and 4B illustrate a semiconductor device 1z according to a comparative example in which a terminal-connecting member 3z does not include the first load-absorbing portion 31a and the second load-absorbing portion 31b illustrated in FIGS. 1A and 1B and extends in a straight line in the horizontal direction as a whole. As illustrated in FIGS. 4A and 4B, applied load when the casing 2 is shrunk is directly reached to the central region M of the terminal-connecting member 3z because the semiconductor device 1z according to the comparative example does not include the first load-absorbing portion 31a and the second load-absorbing portion 31b. Therefore, for example, as illustrated in FIG. 5, when the terminal-connecting member 3z greatly warps upward in a convex shape, distance between the terminal-connecting member 3z and the first insulating circuit-substrate (4a, 41a, 42a) to the third insulating circuit-substrate (4c, 41c, 42c) increases in association with the warpage. Therefore, each height of the first connection-terminal 5a to the third connection-terminal 5c provided in the central region M changes, and the first connection-terminal 5a to the third connection-terminal 5c are separated away from the first terminal-soldering portion 15a to the third terminal-soldering portion 15c, respectively.

On the other hand, when the terminal-connecting member 3z greatly warps downward in a convex shape, the L-shaped legs of the first connection-terminal 5a to the third connection-terminal 5c provided in the central region M are strongly pressed against the first insulating circuit-substrate (4a, 41a, 42a) to the third insulating circuit-substrate (4c, 41c, 42c) respectively. The illustration of a case that the terminal-connecting member 3z greatly warps downward in a convex shape is omitted. Therefore, for example, a failure that the problem that the first insulating circuit-substrate (4a, 41a, 42a) to the third insulating circuit-substrate (4c, 41c, 42c) are damaged is likely to occur. In order to avoid the problem caused by the warpage of the terminal-connecting member 3z, for example, using a large amount of solder is needed. Because of a large amount of solder, electrical connection can be achieved even in a case in which a change in height occurs in bonding regions between the first connection-terminal 5a to the third connection-terminal 5c and the corresponding first terminal-soldering portion 15a to the third terminal-soldering portion 15c. However, manufacturing cost of the semiconductor device 1z according to the comparative example increases. In addition, even in a case in which a large amount of solder is applied, it is difficult to completely prevent the occurrence of the problem. Therefore, in the case of the semiconductor device 1z according to the comparative example, it is difficult to avoid a reduction in yield.

According to the semiconductor device 1a of the first embodiment, in each fixing point at both ends of the terminal-connecting member 3a to the casing 2 respectively, the first load-absorbing portion 31a and the second load-absorbing portion 31b which are intentionally provided at the terminal-connecting member 3a actively absorb the load applied from the casing 2 when the casing 2 is shrunk, in order to prevent the deformation of the central region M of the terminal-connecting member 3a. Therefore, it is possible to restrain a change in each height h of the first connection-terminal 5a to the third connection-terminal 5c provided in the central region M of the terminal-connecting member 3a and to appropriately maintain each height predetermined before molding.

Therefore, even when the casing 2 is shrunk, it is possible to prevent the problems of the semiconductor device 1a caused by the warpage of the terminal-connecting member 3a. For example, it is possible to prevent the first connection-terminal 5a to the third connection-terminal 5c bonded to the first insulating circuit-substrate (4a, 41a, 42a) to the third insulating circuit-substrate (4c, 41c, 42c) before molding from being torn to be separated from the first insulating circuit-substrate (4a, 41a, 42a) to the third insulating circuit-substrate (4c, 41c, 42c) respectively due to the upward warpage of the central region M of the terminal-connecting member 3a. In addition, it is possible to prevent the first connection-terminal 5a to the third connection-terminal 5c from being pressed against the first insulating circuit-substrate (4a, 41a, 42a) to the third insulating circuit-substrate (4c, 41c, 42c) respectively due to the downward warpage of the central region M of the terminal-connecting member 3a, and to avoid the damage of the first insulating circuit-substrate (4a, 41a, 42a) to the third insulating circuit-substrate (4c, 41c, 42c). Therefore, the terminal-connecting member 3a and the first insulating circuit-substrate (4a, 41a, 42a) to the third insulating circuit-substrate (4c, 41c, 42c) are appropriately bonded together, and it is possible to achieve the semiconductor device 1a with high reliability.

First Modification Example

Figure 6:
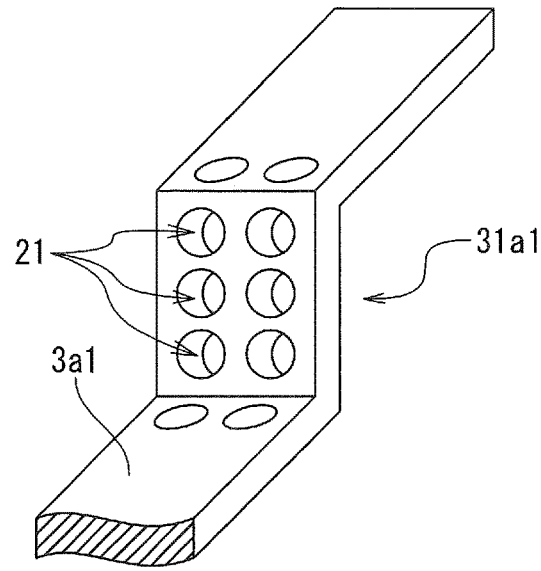
FIG. 6 is a perspective view (bird's-eye view) schematically illustrating an outline of the structure of a load-absorbing portion of a semiconductor device according to a modification example (first modification example) of the first embodiment.

As in a first load-absorbing portion 31a1 of a semiconductor device according to a first modification example illustrated in FIG. 6, one or more holes 21 may be provided in a region of a terminal-connecting member 3a1 in which two bent portions are implemented. The width of a region which substantially contributes to the rigidity of the terminal-connecting member 3a1 and comprises only substantial parts of a plate-shaped member except the width of a space corresponding to the holes 21 is reduced to lower the rigidity of the first load-absorbing portion 31a1 and the second load-absorbing portion. A total of ten holes 21 are provided in the first load-absorbing portion 31a1 of the semiconductor device according to the first modification example. That is, two sets of five holes 21 which are provided in the direction in which the terminal-connecting member 3a1 extends between the side-walls of the casing 2 are provided in parallel to each other in the width direction.

As the shape of the hole 21, in addition to the through-hole illustrated in FIG. 6, for example, a depressed portion that does not penetrate the first load-absorbing portion 31a1 may be used. In addition, the pattern of the outer edge of the hole 21 is not limited to a circle and may be appropriately changed. The other structures of the semiconductor device according to the first modification example are the same as the structure of the semiconductor device 1a illustrated in FIGS. 1 to 3.

In the semiconductor device according to the first modification example, similarly to the semiconductor device 1a illustrated in FIGS. 1 to 3, before the load which is applied from the side-wall of the casing 2 when the casing 2 is shrunk by cooling process is applied to the central region, the first load-absorbing portion 31a1 and the second load-absorbing portion actively absorb the load and are deformed. Therefore, it is possible to restrain a change in the height of the first connection-terminal to the third connection-terminal provided in the central region of the terminal-connecting member 3a1 and to appropriately maintain each height predetermined before molding.

Second Modification Example

Figure 7:
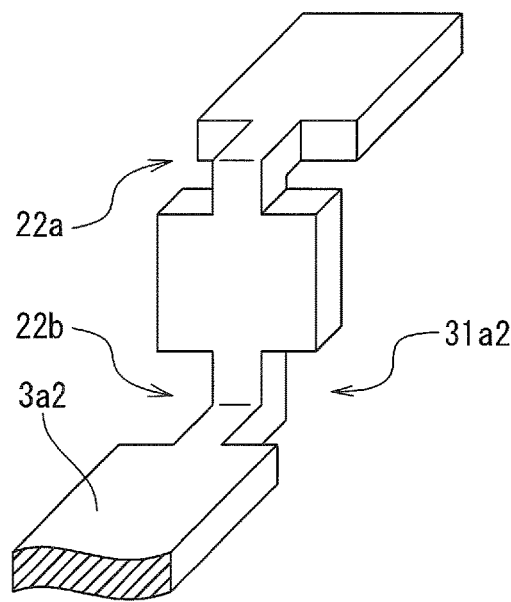
FIG. 7 is a perspective view schematically illustrating an outline of the structure of a load-absorbing portion of a semiconductor device according to a modification example (second modification example) of the first embodiment.

As in a first load-absorbing portion 31a2 of a semiconductor device according to a second modification example illustrated in FIG. 7, a set of narrow constrictions 22a and 22b which have a smaller width than other regions may be provided in the direction in which a terminal-connecting member 3a2 extends between the side-walls of the casing 2. Bent portions are implemented in one set of two narrow constrictions 22a and 22b. This configuration makes it possible to reduce the width of a region that substantially contributes to the rigidity of the terminal-connecting member 3a2 comprises only substantial parts of a plate-shaped member and to reduce the rigidity of the first load-absorbing portion 31a2 and a second load-absorbing portion of the terminal-connecting member 3a2. The other structures of the semiconductor device according to the second modification example are the same as the structure of the semiconductor device 1a illustrated in FIGS. 1 to 3.

In the semiconductor device according to the second modification example, similarly to the semiconductor device 1a illustrated in FIGS. 1 to 3, before the load which is applied from the side-wall of the casing 2 when the casing 2 is shrunk by cooling process is applied to the central region M, the first load-absorbing portion 31a2 and the second load-absorbing portion actively absorb the load and are deformed. Therefore, it is possible to restrain a change in the height of the first connection-terminal to the third connection-terminal provided in the central region of the terminal-connecting member 3a2 and to appropriately maintain each height predetermined before molding.

Third Modification Example

Figure 8:
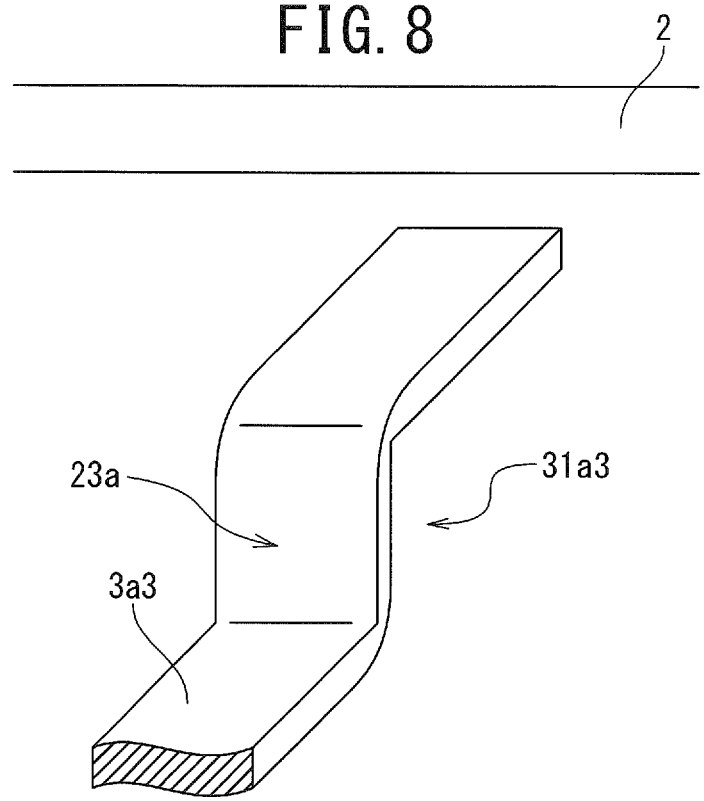
FIG. 8 is a perspective view schematically illustrating an outline of the structure of a load-absorbing portion of a semiconductor device according to a modification example (third modification example) of the first embodiment.

As in a first load-absorbing portion 31a3 of a semiconductor device according to a third modification example illustrated in FIG. 8, a thin-wall structure 23a having a smaller thickness than other regions may be provided between at least one fixing point of a terminal-connecting member 3a3 to the casing 2 and the central region. In the case of the third modification example, it is also possible to reduce the rigidity of the first load-absorbing portion 31a3 and a second load-absorbing portion. FIG. 8 illustrates a case in which bent portions are implemented at each of both ends of the thin-wall structure 23a in the direction in which the terminal-connecting member 3a3 extends between the side-walls of the casing 2. The other structures of the semiconductor device according to the third modification example are the same as the structure of the semiconductor device 1a illustrated in FIGS. 1 to 3.

In the semiconductor device according to the third modification example, similarly to the semiconductor device 1a illustrated in FIGS. 1 to 3, before the load which is applied from the side-wall of the casing 2 when the casing 2 is shrunk by cooling process is applied to the central region, the first load-absorbing portion 31a3 and the second load-absorbing portion actively absorb the load and are deformed. Therefore, it is possible to restrain a change in the height of the first connection-terminal to the third connection-terminal provided in the central region of the terminal-connecting member 3a3 and to appropriately maintain each height predetermined before molding.

Fourth Modification Example

Figure 9:
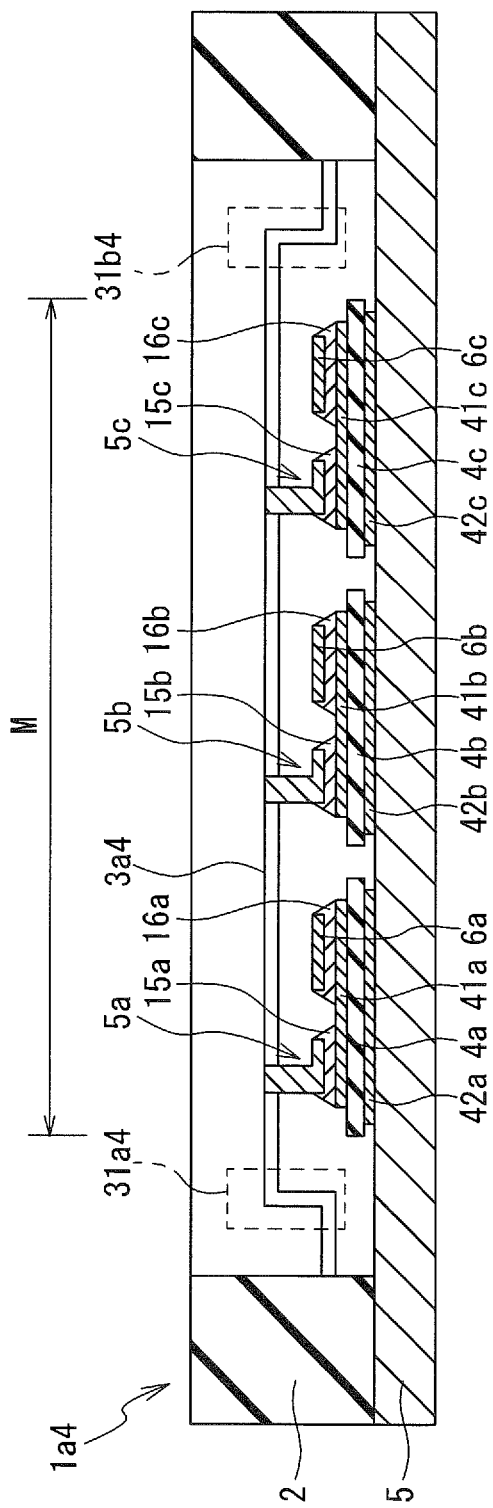
FIG. 9 is a cross-sectional view schematically illustrating an outline of the structure of a semiconductor device according to a modification example (fourth modification example) of the first embodiment.

As in a first load-absorbing portion 31a4 and a second load-absorbing portion 31b4 of a terminal-connecting member 3a4 in a semiconductor device 1a4 according to a fourth modification example illustrated in FIG. 9, a structure in which the first load-absorbing portion 31a and the second load-absorbing portion 31b with a Z-shape or a step-shape as illustrated in FIG. 1B are turned upside down may be used. In the case of the fourth modification example, it is also possible to achieve the semiconductor device according to the first embodiment. The other structures of the semiconductor device according to the fourth modification example are the same as the structure of the semiconductor device 1a illustrated in FIGS. 1 to 3.

In the semiconductor device 1a4 according to the fourth modification example, similarly to the semiconductor device 1a illustrated in FIGS. 1 to 3, before the load which is applied from the side-wall of the casing 2 when the casing 2 is shrunk by cooling process is applied to the central region M, the first load-absorbing portion 31a4 and the second load-absorbing portion 31b4 actively absorb the load and are deformed. Therefore, it is possible to restrain a change in each height of the first connection-terminal 5a to the third connection-terminal 5c provided in the central region M of the terminal-connecting member 3a4 and to appropriately maintain each height predetermined before molding.

In addition, in the semiconductor device 1a4 according to the fourth modification example, as illustrated in FIG. 9, each of both ends of the terminal-connecting member 3a4 is fixed at each lower part of the side-walls of the casing 2 respectively. The terminal-connecting member 3a4 is bent at two positions so that the central region M is higher than the fixing points to the casing 2, and so that the first load-absorbing portion 31a4 and the second load-absorbing portion 31b4 are implemented. The terminal-connecting member 3a4 is suspended above the first insulating circuit-substrate (4a, 41a, 42a) to the third insulating circuit-substrate (4c, 41c, 42c). Therefore, even when the first load-absorbing portion 31a4 and the second load-absorbing portion 31b4 are deformed by the load applied during shrinking so that the deformation is performed vertically symmetrical to the deformation state as illustrated in FIG. 3, a deformed-region is located below the central region M and no part protrudes from the central region M of the terminal-connecting member 3a4. That is, the fixing point of the terminal-connecting member 3a4 to the casing 2 is disposed between the base portion 5 and the central region M, and an internal space of the casing 2 is used so that the first insulating circuit-substrate (4a, 41a, 42a) to the third insulating circuit-substrate (4c, 41c, 42c) are accommodated between the base portion 5 and the central region M. Therefore, it is possible to prevent an increase in the overall height of the semiconductor device 1a4 and to reduce the size of the semiconductor device 1a4.

—Semiconductor Device Manufacturing Method—

Next, an example of a method for manufacturing the semiconductor device 1a according to the first embodiment illustrated in FIGS. 1 to 3 will be described with reference to FIGS. 10A and 10B. First, as illustrated in FIG. 10A, the first insulating circuit-substrate (4a, 41a, 42a) to the third insulating circuit-substrate (4c, 41c, 42c) are prepared. The prepared first insulating circuit-substrate (4a, 41a, 42a) to the third insulating circuit-substrate (4c, 41c, 42c) are mounted and bonded to predetermined positions on the base portion 5 for heat dissipation. In addition, the terminal-connecting member 3a illustrated in FIG. 1B, which is made of metal such as copper, and in which the first load-absorbing portion 31a and the second load-absorbing portion 31b are implemented at position adjacent to each of both ends, and the first connection-terminal 5a to the third connection-terminal 5c are provided in a central region, is prepared.

Then, the first terminal-soldering portion 15a to the third terminal-soldering portion 15c and the first chip-soldering portion 16a to the third chip-soldering portion 16c are disposed in predetermined regions of the surfaces of the first insulating circuit-substrate (4a, 41a, 42a) to the third insulating circuit-substrate (4c, 41c, 42c) by, for example, a solder plating process using a printing technique. Then, the first semiconductor chip 6a to the third semiconductor chip 6c are mounted and bonded to the top surfaces of the first chip-soldering portion 16a to the third chip-soldering portion 16c, respectively.

Then, as illustrated in FIG. 10B, the bottom surfaces of the first connection-terminal 5a to the third connection-terminal 5c of the terminal-connecting member 3a are bonded to the top surfaces of the first terminal-soldering portion 15a to the third terminal-soldering portion 15c, respectively. Then, the casing 2 illustrated in FIGS. 1A and 1B which is made of such as a resin and insert members are integrally molded by, for example, transfer molding. The insert members which are inserted into the casing 2 are the first insulating circuit-substrate (4a, 41a, 42a) to the third insulating circuit-substrate (4c, 41c, 42c) and the terminal-connecting member 3a.

When cooling process of the casing 2 is performed after the molding, the casing 2 which is made of such as a resin is shrunk more than the terminal-connecting member 3a which is made of metal is shrunk due to a difference in linear expansion coefficient, and load is applied to the terminal-connecting member 3a from the side-walls of the casing 2 due to a difference in shrinkage ratio. Here, the first load-absorbing portion 31a and the second load-absorbing portion 31b of the terminal-connecting member 3a actively absorb the applied load. Therefore, as illustrated in FIG. 3, each height h of the first connection-terminal 5a to the third connection-terminal 5c does not change and an appropriate height is maintained.

Then, the surface of an electrode, such as an output electrode or a gate electrode, of the semiconductor chip and a predetermined connection-terminal provided in the casing 2 are connected to each other by a connection member, such as a bonding-wire or a lead-frame, although the illustration of the electrode, the connection-terminal and the connection member are omitted. Then, the casing 2 is filled with a protective filler, such as silicone gel or an epoxy resin, and the protective filler is hardened to predetermined hardness to seal the casing 2. Then, the semiconductor device 1a according to the first embodiment might be obtained. A cooling unit may be attached on the bottom surface of the base portion 5 of the obtained semiconductor device 1a through thermal grease, etc.

According to the method for manufacturing the semiconductor device 1a of the first embodiment, it is possible to restrain a change in each height of the first connection-terminal 5a to the third connection-terminal 5c provided in the central region of the terminal-connecting member 3a and to appropriately maintain each height predetermined before molding. Therefore, it is possible to appropriately bond the terminal-connecting member 3a and the first insulating circuit-substrate (4a, 41a, 42a) to the third insulating circuit-substrate (4c, 41c, 42c) and to prevent the damage of the first insulating circuit-substrate (4a, 41a, 42a) to the third insulating circuit-substrate (4c, 41c, 42c). As a result, it is possible to manufacture the semiconductor device 1a according to the first embodiment with high yield.

Second Embodiment

A semiconductor device 1b according to a second embodiment includes a plate-shaped base portion 5 illustrated in FIG. 11B and first insulating circuit-substrate (4a, 41a, 42a) to the third insulating circuit-substrate (4c, 41c, 42c) which are provided on the base portion 5 and on which first semiconductor chip 6a to the third semiconductor chip 6c are mounted respectively, as illustrated in FIGS. 11A and 11B. In addition, the semiconductor device 1b according to the second embodiment includes a casing 2 which is provided on the base portion 5 and accommodates the first insulating circuit-substrate (4a, 41a, 42a) to the third insulating circuit-substrate (4c, 41c, 42c). In the casing 2, a plate-shaped terminal-connecting member 3b is provided to extend as a beam structure between two opposite side-walls which are located on the left and right sides of FIGS. 11A and 11B. Each of both ends of the terminal-connecting member 3b are suspended and fixed to the side-walls respectively.

The terminal-connecting member 3b includes three connection-terminals of the first connection-terminal 5a to the third connection-terminal 5c which are electrically connected to the first semiconductor chip 6a to the third semiconductor chip 6c, respectively. In addition, the terminal-connecting member 3b includes a first load-absorbing portion 131a provided between a central region M and one of the two side-walls which is illustrated on the left side in FIGS. 11A and 11B. The terminal-connecting member 3b includes a second load-absorbing portion 131b provided between the central region M and the other side-wall which is illustrated on the right side in FIGS. 11A and 11B.

As illustrated in FIG. 11B, in the terminal-connecting member 3b of the semiconductor device 1b according to the second embodiment, each of the first load-absorbing portion 131a and the second load-absorbing portion 131b is bent 90 degrees four times between an fixing point to the side-wall of the casing 2 and the central region M. Therefore, as illustrated in FIG. 11B, the first load-absorbing portion 131a and the second load-absorbing portion 131b of the terminal-connecting member 3b have an inverted U-shape in a side-view pattern. In FIG. 11B, the U-shape is implemented in upper area than the fixing point to the casing 2 and the central region M. That is, the semiconductor device 1b according to the second embodiment differs from the single-bent-type semiconductor device according to the first embodiment, including two bent portions. The semiconductor device 1b is a double-bent-type, including four bent portions between the fixing point of the terminal-connecting member 3b to the casing 2 and the central region M.

Slits 32a1 to 32a3 are provided in the first load-absorbing portion 131a and slits 32b1 to 32b3 are provided in the second load-absorbing portion 131b, of the semiconductor device 1b according to the second embodiment, respectively. Therefore, the width of a region which substantially contributes to the rigidity of the terminal-connecting member 3b and comprises only substantial parts of a plate-shaped member except the width of a spatial portion corresponding to the slits in the first load-absorbing portion 131a and the second load-absorbing portion 131b is reduced. The rigidity of the first load-absorbing portion 131a and the second load-absorbing portion 131b is equal to or less than 50% of the rigidity of the central region M. Since the other structures of the semiconductor device 1b according to the second embodiment are the same as the structure of the semiconductor device 1a according to the first embodiment, the duplicate description will be omitted.

Figure 12:
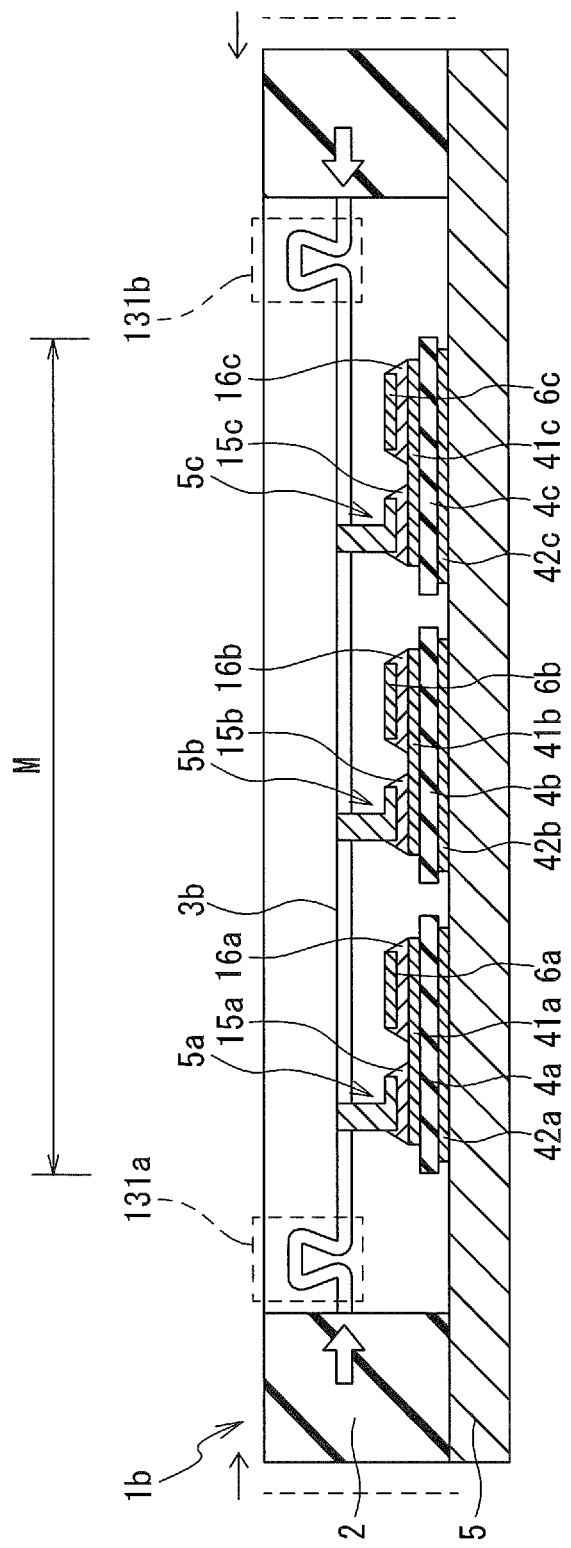
FIG. 12 is a cross-sectional view schematically illustrating an outline of the structure of the semiconductor device after shrinking according to the second embodiment.

As illustrated in FIG. 12, in the semiconductor device 1b according to the second embodiment, similarly to the semiconductor device 1a according to the first embodiment, before the load applied from the side-wall of the casing 2 when the casing 2 is shrunk by cooling process is applied to the central region M, the first load-absorbing portion 131a and the second load-absorbing portion 131b actively absorb the load, and then, are deformed. Therefore, it is possible to restrain a change in each height of the first connection-terminal 5a to the third connection-terminal 5c provided in the central region M of the terminal-connecting member 3b and to appropriately maintain each height predetermined before molding.

According to the semiconductor device 1b of the second embodiment, the first load-absorbing portion 131a and the second load-absorbing portion 131b are a double-bent-type including four bent portions. Therefore, the double-bent-type is more easily deformed than the single-bent-type including two bent portions. As a result, it is possible to more effectively prevent the warpage of the central region M of the terminal-connecting member 3b than the terminal-connecting member in the semiconductor device 1a according to the first embodiment. The other effectiveness of the semiconductor device 1b according to the second embodiment is the same as the structure of the semiconductor device 1a according to the first embodiment.

Fifth Modification Example

Figure 13:
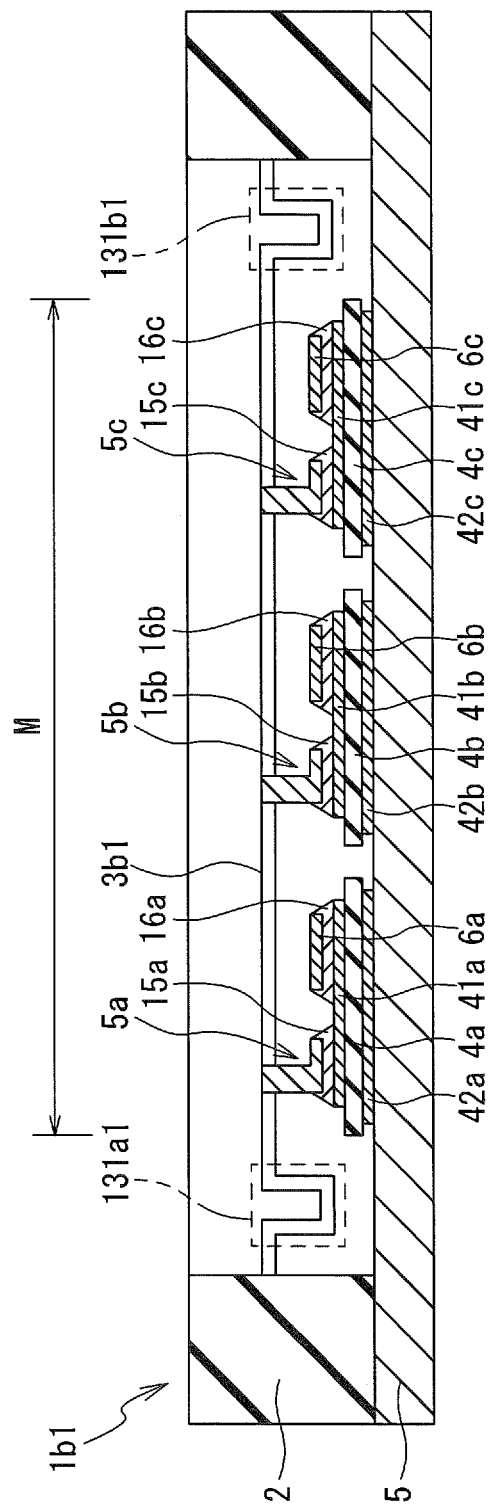
FIG. 13 is a cross-sectional view schematically illustrating an outline of the structure of a load-absorbing portion of a semiconductor device according to a modification example (fifth modification example) of the second embodiment.

As in a first load-absorbing portion 131a1 and a second load-absorbing portion 131b1 of a terminal-connecting member 3b1 in a semiconductor device 1b1 according to a fifth modification example illustrated in FIG. 13, a structure in which the first load-absorbing portion 131a and the second load-absorbing portion 131b with a U-shape illustrated in FIG. 11B are turned upside down may be used. In the case of the fifth modification example, it is also possible to achieve the semiconductor device according to the second embodiment. In the first load-absorbing portion 131a1 and the second load-absorbing portion 131b1 of the terminal-connecting member 3b1, the U-shape implemented by four bent portions is formed so as to protrude toward the base portion 5 in lower than the central region M.

In the semiconductor device 1b1 according to the fifth modification example, similarly to the semiconductor device 1b illustrated in FIGS. 11A and 11B and FIG. 12, when the casing 2 is shrunk by cooling process, the first load-absorbing portion 131a1 and the second load-absorbing portion 131b1 actively absorb the load from the side-wall of the casing 2 before the load is reached to the central region M, and then, are deformed. Therefore, it is possible to restrain a change in each height of the first connection-terminal 5a to the third connection-terminal 5c provided in the central region M of the terminal-connecting member 3b1 and to appropriately maintain each height predetermined before molding.

According to the semiconductor device 1b1 of the fifth modification example, as illustrated in FIG. 13, the terminal-connecting member 3b1 is fixed at the position which is located substantially at the center of the side-wall of the casing 2 in vertical direction. In addition, the terminal-connecting member 3b1 includes four bent portions each of which is bent 90 degrees between the fixing point to the casing 2 and the central region M and is suspended above the first insulating circuit-substrate (4a, 41a, 42a) to the third insulating circuit-substrate (4c, 41c, 42c). The height of the central region M of the terminal-connecting member 3b1 is substantially equal to the height of the fixing point to the casing 2. Therefore, even when the first load-absorbing portion 131a1 and the second load-absorbing portion 131b1 are deformed by the load applied during shrinking so that the deformation is performed vertically symmetrical to the deformation state illustrated in FIG. 12, a deformed-region is located below the central region M and no part protrudes upward from the central region M of the terminal-connecting member 3b1. As a result, it is possible to prevent an increase in the overall height of the semiconductor device 1b1 and to reduce the size of the semiconductor device 1b1.

Third Embodiment

A semiconductor device 1c according to a third embodiment includes a plate-shaped base portion 5 illustrated in FIG. 14B and first insulating circuit-substrate (4a, 41a, 42a) to the third insulating circuit-substrate (4c, 41c, 42c) which are provided on the base portion 5 and on which first semiconductor chip 6a to the third semiconductor chip 6c are mounted respectively, as illustrated in FIGS. 14A and 14B. In addition, the semiconductor device 1c according to the third embodiment includes a casing 2 which is provided on the base portion 5 and accommodates the first insulating circuit-substrate (4a, 41a, 42a) to the third insulating circuit-substrate (4c, 41c, 42c). In the casing 2, a plate-shaped terminal-connecting member 3c is provided to extend as a beam structure between two opposite side-walls which are located on the left and right sides of FIGS. 14A and 14B. Each of both ends of the terminal-connecting member 3c are suspended and fixed to the side-walls respectively.

The terminal-connecting member 3c includes three connection-terminals of first connection-terminal 5a to the third connection-terminal 5c which are electrically connected to the first semiconductor chip 6a to the third semiconductor chip 6c, respectively. In addition, the terminal-connecting member 3c includes a first load-absorbing portion 231a provided between a central region M and one of the two side-walls which is illustrated on the left side in FIGS. 14A and 14B. The terminal-connecting member 3c includes a second load-absorbing portion 231b provided between the central region M and the other side-wall which is illustrated on the right side in FIGS. 14A and 14B.

The semiconductor device 1c according to the third embodiment differs from the semiconductor devices according to the first and second embodiments in point that a left-side fixing point of the terminal-connecting member 3c to the casing 2, a first load-absorbing portion 231a close to the left-side fixing point, a central region M, a second load-absorbing portion 231b which is provided so as to be opposite to the first load-absorbing portion 231a with the central region M interposed between the first load-absorbing portion 231a and the second load-absorbing portion 231b, and a right-side fixing point to the casing 2 have the same height, as illustrated in FIG. 14A. In the case of the semiconductor device 1c according to the third embodiment, the narrow structure provided in the first load-absorbing portion 31a2 of the semiconductor device according to the second modification example illustrated in FIG. 7 is applied in the first load-absorbing portion 231a and the second load-absorbing portion 231b. In the semiconductor device 1c according to the third embodiment, similarly to the second modification example illustrated in FIG. 7, the narrow constriction structure causes the rigidity of the first load-absorbing portion 231a and the second load-absorbing portion 231b to be equal to or less than 50% of the rigidity of the central region M.

Therefore, in the semiconductor device 1c according to the third embodiment, as illustrated in FIG. 14A, the fixing point to the left side-wall of the casing 2, the first load-absorbing portion 231a, and the central region M implement a Z-shape in a plane pattern. In addition, the fixing point to the right side-wall of the casing 2, the second load-absorbing portion 231b, and the central region M implement a Z-shape in a plane pattern. Since the other structures of the semiconductor device 1c according to the third embodiment are the same as the structure of the semiconductor devices according to the first and second embodiments, the duplicate description will be omitted.

As illustrated in FIG. 15, in the semiconductor device 1c according to the third embodiment, similarly to the semiconductor devices according to the first and second embodiments, when the casing 2 is shrunk by cooling process, the first load-absorbing portion 231a and the second load-absorbing portion 231b actively absorb the load from the side-wall of the casing 2 before the load is reached to the central region M, and then, are deformed. Therefore, it is possible to restrain a change in each height of the first connection-terminal 5a to the third connection-terminal 5c provided in the central region M of the terminal-connecting member 3c and to appropriately maintain each height predetermined before molding.

According to the semiconductor device 1c of the third embodiment, as illustrated in FIG. 14B, the terminal-connecting member 3c is flat in a side-view pattern. As illustrated in FIG. 15, even when load is applied, the first load-absorbing portion 231a and the second load-absorbing portion 231b are deformed at the same height as a predetermined height before shrinking. Therefore, since no part protrudes upward in the terminal-connecting member 3c, it is possible to prevent an increase in the overall height of the semiconductor device 1c and to reduce the size of the semiconductor device 1c. The other effectiveness of the semiconductor device 1c according to the third embodiment is the same as the structure of the semiconductor devices according to the first and second embodiments.

Other Embodiments

The present invention has been described with reference to the above-described embodiments. It will be understood that the description and the drawings forming a portion of the disclosure do not limit the present invention. It will be apparent to those skilled in the art that various modifications, embodiments, and application techniques of the present disclosure can be made.

For example, in the first to the third embodiments, the rectangular-parallelepiped-shaped casing 2 having a rectangular shape in the plane pattern has been described as the casing 2. However, the shape of the casing 2 is not limited to the rectangular parallelepiped. The casing 2 may be implemented in other shapes, such as a hexagonal column and an octagonal column, as long as side-walls in the casing 2 is included, implementing a set of opposite sides.

In the first to the third embodiments, the case has been described in which the terminal-soldering portion and the chip-soldering portion are individually disposed on the top-surface conductive-layer of the insulating circuit-substrate so as to be separated from each other, are bonded to the connection-terminal of the terminal-connecting member and the semiconductor chip, respectively, and are electrically connected to each other by such as wire bonding. However, a method for connecting the connection-terminal and the semiconductor chip is not limited to the method using the individual soldering portions and other connection methods may be used. For example, a connection method may be used in which one soldering portion with a predetermined shape is provided on the top-surface conductive-layer so that the corresponding connection-terminal and semiconductor chip can be bonded each other at the same time.

In the first to the third embodiments, as a method for reducing the rigidity of the first load-absorbing portion and the second load-absorbing portion, the method has been described in which a through hole is provided or the width is reduced to change the shape of the first load-absorbing portion and the second load-absorbing portion. However, the method for reducing the rigidity is not limited to the method which changes the shape. For example, a method in which the material implementing the first load-absorbing portion and the second load-absorbing portion is different from the material implementing the central region M may be used to reduce the rigidity.

A reduction in the rigidity can be checked by simulated calculation using, for example, the material implementing the terminal-connecting member and the shape and dimensions of the regions of the first load-absorbing portion and the second load-absorbing portion. Alternatively, other methods may be used. For example, the first and second load-absorbing portions may be cut out from the terminal-connecting member, and a region except the first and second load-absorbing portions may be cut out from the terminal-connecting member, and the rigidity of each of the cutout regions may be measured by such as an appropriate measurement device.

As a semiconductor element which is a semiconductor chip, various semiconductor elements such as an IGBT, a MOSFET, and a diode which can be used in semiconductor modules may be used. In addition, the configurations of the semiconductor devices illustrated in FIGS. 1 to 15 may be partially combined to achieve the semiconductor device according to the present invention. As described above, the present invention includes, for example, various embodiments which have not been described above and the technical scope of the present invention is defined by only matters specifying the present invention described in the appropriate claims of the present invention.

What is claimed is:

1. A semiconductor device comprising:
   an insulating circuit-substrate on which a semiconductor chip is mounted;
   a casing accommodating the insulating circuit-substrate; and
   a plate-shaped terminal-connecting member having first and second ends suspended so that the terminal-connecting member extends between two opposite side-walls of the casing, the terminal-connecting member having a connection-terminal and load-absorbing portions, the connection-terminal being provided in a central region between the first and second ends and connected to the semiconductor chip, the load-absorbing portions being provided between fixing points to the casing and the central region, the rigidity of the load-absorbing portions in a longitudinal direction being equal to or less than 50% of the rigidity of the central region so that the load-absorbing portions absorb a load applied from the two opposite side-walls and are deformed.

2. The semiconductor device according to claim 1, wherein at least one of the load-absorbing portions has a Z shape or a step-shape in a side view pattern.

3. The semiconductor device according to claim 2, wherein each of the load-absorbing portions has a hole.

4. The semiconductor device according to claim 2, wherein a width of at least one of the load-absorbing portions in the longitudinal direction is less than a width of the central region in the longitudinal direction.

5. The semiconductor device according to claim 2, wherein a thickness of at least one of the load-absorbing portions in a direction perpendicular to the longitudinal direction is less than a thickness of the central region in the direction perpendicular to the longitudinal direction.

6. The semiconductor device according to claim 2, wherein the fixing points are lower than the central region.

7. The semiconductor device according to claim 1, wherein each of the load-absorbing portions has four bent portions to have a U-shape.

8. The semiconductor device according to claim 7, wherein
   the each of the load-absorbing portions having the U-shape includes a first portion elongated in the longitudinal direction, a second portion connected to one end of the first portion, and a third portion connected to another end of the first portion, and
   the first portion is provided closer to the insulating circuit-substrate than the central region.

9. The semiconductor device according to claim 1, wherein
   at least one of the load-absorbing portions is provided at a same height as the central region,
   a connection of one of the fixing points, one of the load-absorbing portions, and the central region implements a Z-shape or a step-shape, and
   a width of the at least one of the load-absorbing portions in the longitudinal direction is less than a width of the central region in the longitudinal direction.

10. A method for manufacturing a semiconductor device comprising:
    mounting a semiconductor chip on an insulating circuit-substrate;
    preparing a plate-shaped terminal-connecting member having a connection-terminal and load-absorbing portions, the connection-terminal being provided in a central region, the load-absorbing portions being provided outside the central region, the rigidity of the load-absorbing portions in a longitudinal direction being equal to or less than 50% of the rigidity of the central region;
    connecting the connection-terminal to the semiconductor chip; and
    inserting the insulating circuit-substrate and the terminal-connecting member into a casing so that the terminal-connecting member is fixed at two opposite side-walls of the casing outside the load-absorbing portions and is suspended and extends between the two opposite side-walls and integrally molding the casing,
    wherein the load-absorbing portions absorb a load applied from the two opposite side-walls and are deformed when the integrally molded casing is shrunk.

11. The method according to claim 10, further comprising:
    performing a cooling process after integrally molding the casing to shrink the integrally molded casing; and
    deforming the load-absorbing portions before the load applied from the two opposite side-walls is absorbed by the central region.

12. A semiconductor device, comprising:
    an insulating circuit-substrate on which a semiconductor chip is mounted;
    a casing accommodating the insulating circuit-substrate, the casing having a first side-wall and a second side-wall, the first side-wall facing the second side-wall; and
    a terminal-connecting member extending from the first side-wall to the second side-wall, the terminal-connecting member including:
    a first end connected to the first side-wall of the casing, a second end connected to the second side-wall of the casing, a central region provided between the first end and the second end and elongated in a longitudinal direction, a connection-terminal, provided in the central region, and connected to the semiconductor chip, a first load-absorbing portion provided between the central region and the first end, and a second load-absorbing portion provided between the central region and the second end connected to the second side-wall, a rigidity of the first and second load-absorbing portions in the longitudinal direction being equal to or less than 50% of a rigidity of the central region such that the first load-absorbing portion is configured to absorb a first load applied from the first side-wall and be deformed and the second load-absorbing portion is configured to absorb a second load applied from second side-wall and be deformed.

13. The semiconductor device according to claim 12, wherein the first and second load-absorbing portions are symmetrically provided with respect to the central region.

14. The semiconductor device according to claim 12, wherein the terminal-connecting member is plate-shaped or rod-shaped.

15. The semiconductor device according to claim 12, wherein a plurality of slits are provided in the first load-absorbing portion at equal intervals.

16. The semiconductor device according to claim 12, wherein a thickness of the terminal-connecting member is constant.

17. The semiconductor device according to claim 12, wherein the first load-absorbing portion includes:

a first portion, connected at one end to the first end of the terminal-connecting member, and elongated in the longitudinal direction, a second portion, connected at one end to the central region of the terminal-connecting member, and elongated in the longitudinal direction, and a third portion, connected to the first portion and the second portion, and elongated in a direction which is not parallel to the longitudinal direction.

18. The semiconductor device according to claim 17, wherein the first portion is provided above the second portion and the insulating circuit-substrate.

19. The semiconductor device according to claim 12, wherein the terminal-connecting member is configured so that when the first load is applied from the first side-wall to the first load-absorbing portion and the second load is applied from the second side-wall to the second load-absorbing portion, the first and second load-absorbing portions are deformed before the first load and the second load are absorbed by the central region.

20. The semiconductor device according to claim 12, wherein the terminal-connecting member is configured so that when the first load is applied from the first side-wall to the first load-absorbing portion and the second load is applied from the second side-wall to the second load-absorbing portion, a height between the connection terminal and a soldering portion provided on the insulating circuit-substrate is maintained.

* * * * *